United States Patent
Mitsui et al.

(10) Patent No.: US 8,659,147 B2
(45) Date of Patent: Feb. 25, 2014

(54) POWER SEMICONDUCTOR CIRCUIT DEVICE AND METHOD FOR MANUFACTURING THE SAME

(75) Inventors: Takao Mitsui, Chiyoda-ku (JP); Hiroyuki Yoshihara, Chiyoda-ku (JP); Toru Kimura, Chiyoda-ku (JP); Masao Kikuchi, Chiyoda-ku (JP); Yoichi Goto, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 309 days.

(21) Appl. No.: 12/988,035

(22) PCT Filed: Jun. 4, 2009

(86) PCT No.: PCT/JP2009/060264
§ 371 (c)(1),
(2), (4) Date: Oct. 15, 2010

(87) PCT Pub. No.: WO2009/150995
PCT Pub. Date: Dec. 17, 2009

(65) Prior Publication Data
US 2011/0031612 A1   Feb. 10, 2011

(30) Foreign Application Priority Data

Jun. 12, 2008 (JP) ................................. 2008-153935
Sep. 19, 2008 (JP) ................................. 2008-240318

(51) Int. Cl.
*H01L 23/34* (2006.01)
*H01L 21/50* (2006.01)

(52) U.S. Cl.
USPC ............................. 257/713; 438/122; 257/712

(58) Field of Classification Search
USPC ................... 257/E23.08, 712, 706, 675, 625; 438/122
See application file for complete search history.

(56) References Cited

U.S. PATENT DOCUMENTS 5,014,776 A * 5/1991 Hess .............................. 165/185
5,247,734 A * 9/1993 Lubbe et al. .............. 29/890.045

(Continued)

FOREIGN PATENT DOCUMENTS

| JP | 2-238653 A | 9/1990 |
|----|------------|--------|
| JP | 11-204700 A | 7/1999 |
| JP | 2000-151163 A | 5/2000 |
| JP | 2001-053212 A | 2/2001 |
| JP | 2001-352020 A | 12/2001 |
| JP | 2001352020 A * | 12/2001 |
| JP | 2002-299864 A | 10/2002 |
| JP | 2002299864 A * | 10/2002 |

(Continued)

OTHER PUBLICATIONS

International Search Report (PCT/ISA/210) issued on Aug. 11, 2009, by Japanese Patent Office as the International Searching Authority for International Application No. PCT/JP2009/060264.

*Primary Examiner* — Long K Tran
*Assistant Examiner* — Jordan Klein
(74) *Attorney, Agent, or Firm* — Buchanan Ingersoll & Rooney PC

(57) ABSTRACT

A power semiconductor circuit device and a method for manufacturing the same, both of which are provided with: a base board on which at least a power semiconductor element is mounted; a resin which molds the base board and the power semiconductor element in a state where partial surfaces of the base board, including a base board surface opposite to a surface on which the power semiconductor element is mounted, are exposed; and a heat dissipating fin joined to the base board by a pressing force. A groove is formed in the base board at a portion to be joined to the heat dissipating fin, and the heat dissipating fin is joined by caulking to the groove.

14 Claims, 7 Drawing Sheets

(56) References Cited

U.S. PATENT DOCUMENTS

| | | | |
|---|---|---|---|
| 5,533,257 A * | 7/1996 | Romero et al. | 29/890.03 |
| 6,176,304 B1 * | 1/2001 | Lee | 165/185 |
| 2007/0138624 A1 * | 6/2007 | Sudo et al. | 257/706 |
| 2007/0223195 A1 * | 9/2007 | Honma | 361/709 |

FOREIGN PATENT DOCUMENTS

| | | | |
|---|---|---|---|
| JP | 2003-158226 A | | 5/2003 |
| JP | 2003158226 A | * | 5/2003 |
| JP | 2007-173272 A | | 7/2007 |
| JP | 3140755 U | | 3/2008 |

* cited by examiner

POWER SEMICONDUCTOR CIRCUIT DEVICE AND METHOD FOR MANUFACTURING THE SAME

TECHNICAL FIELD

The present invention relates to a power semiconductor circuit device equipped with a power semiconductor element and a method for manufacturing the same and, more particularly, relates to a power semiconductor circuit device and a method for manufacturing the same, both of which are formed with a heat dissipating fin on a base board of the power semiconductor circuit device.

BACKGROUND ART

In the past, a large number of power semiconductor circuit devices have been configured so as to be cooled by being fixed to a heat sink serving as a heat dissipating member via grease or the like. The grease is used to fill unevenness of a contact surface between the power semiconductor circuit device and the heat sink and to reduce contact thermal resistance. However, thermal conductivity of the grease is considerably small as compared to metals; and therefore, in the case of achieving high heat dissipation of the device, the power semiconductor circuit device needs to be fixed to the heat sink without via the grease.

Consequently, in order to integrate a base board of the heat sink and a base board of the power semiconductor circuit device without via grease that is an impediment to achieving high heat dissipation of the power semiconductor circuit device, a heat dissipating fin of the heat sink is bonded by thermocompression to the base board of the power semiconductor circuit device with a high thermal conductivity insulation resin sheet or formed integrally, and electronic components such as power semiconductor elements and wiring members are mounted on the base board of the power semiconductor circuit device; accordingly, high heat dissipation of the power semiconductor circuit device is achieved. (For example, see Patent Document 1.)

PRIOR ART DOCUMENT

Patent Document
  Patent Document 1: Japanese Unexamined Patent Publication No. 11-204700

DISCLOSURE OF THE INVENTION

Problems to be Solved by the Invention

In such a power semiconductor circuit device, the electronic components such as the power semiconductor elements and wiring members are mounted on the base board to which the heat dissipating fin is preliminarily bonded by thermocompression with the high thermal conductivity insulation resin sheet or formed integrally; and then, a casing is made of a molding resin. However, if the heat dissipating fin is attached to the base board of the power semiconductor circuit device before the electronic components such as the power semiconductor elements and wiring members are mounted, heat capacity of the base board of the power semiconductor circuit device becomes large; consequently, not only soldering becomes difficult but also a conventional jig cannot be used even in a wire bond process; and thus, a special jig has to be made for each shape of the base board and the heat dissipating fin. Then, a tooling change of equipment such as jig replacement is also needed each time a manufacturing product is changed. Furthermore, the device becomes large because the heat dissipating fin is attached; therefore, the number of the power semiconductor circuit devices that can be stored in a storage container is small during manufacturing products; and thus, provision by a person or a dedicated machine is always needed and productivity becomes considerably bad.

In order to solve these problems, the base board of the power semiconductor circuit device is preliminarily made as a thin base board, the electronic components such as the power semiconductor elements and wiring members are mounted on such thin base board, and finally the heat dissipating fin is attached; accordingly, such problems can be solved. However, when a thermal fixing method such as soldering and welding is used for attaching the heat dissipating fin to the base board, productivity is bad because heat capacity of a power semiconductor device is large. On the other hand, when the heat dissipating fin is to be mechanically formed to the base board of the completed power semiconductor circuit device, stress is applied to the power semiconductor circuit device during forming the heat dissipating fin; and consequently, damage to the power semiconductor circuit device becomes problematic.

The present invention has been made to solve the problem as described above, and an object of the present invention is to provide a power semiconductor circuit device and a method for manufacturing the same, both of which are capable of simplifying manufacturing processes, reducing stress to be applied on the power semiconductor circuit device during forming a heat dissipating fin, and satisfying both of high heat dissipation and productivity of the power semiconductor circuit device.

Means for Solving the Problem

A power semiconductor circuit device according to the present invention, in the power semiconductor circuit device equipped with a power semiconductor element, includes: a base board on which at least the power semiconductor element is mounted; a resin which molds the base board and the power semiconductor element in a state where partial surfaces of the base board, including a base board surface opposite to a surface on which the power semiconductor element is mounted, are exposed; and a heat dissipating fin joined to the base board by a pressing force. The base board is processed with a groove at a portion to be joined to the heat dissipating fin, and the heat dissipating fin is fixed by caulking to the groove.

Furthermore, a method for manufacturing a power semiconductor circuit device according to the present invention includes the steps of: mounting at least a power semiconductor element on one surface of a base board and forming a groove which is for joining in an opposite surface of the base board; molding the base board and the power semiconductor element in a state where partial surfaces of the base board, including the base board surface opposite to the surface on which the power semiconductor element is mounted, are exposed; and then, fixing the heat dissipating fin by caulking to the groove of the base board.

Advantageous Effect of the Invention

According to a power semiconductor circuit device of the present invention, a heat dissipating fin can be formed without giving damage to the power semiconductor circuit device in manufacturing processes; furthermore, the manufacturing processes can be simplified; and a heat dissipating fin conformed to heat dissipation specifications of the power semiconductor circuit device can be formed with good productivity without a tooling change of equipment such as jig replacement for each manufacturing product.

The foregoing and other object, features, and advantages of the present invention will become more apparent from the following detailed description of preferred embodiments and description shown in drawings.

BEST MODE FOR CARRYING OUT THE INVENTION

Hereinafter, preferred embodiments on a power semiconductor circuit device (also referred to as a "power module" later) and a method for manufacturing the same according to the present invention will be described with reference to the accompanying drawings.

Incidentally, the present invention is not limited by the embodiments.

Embodiment 1

Figure 1:
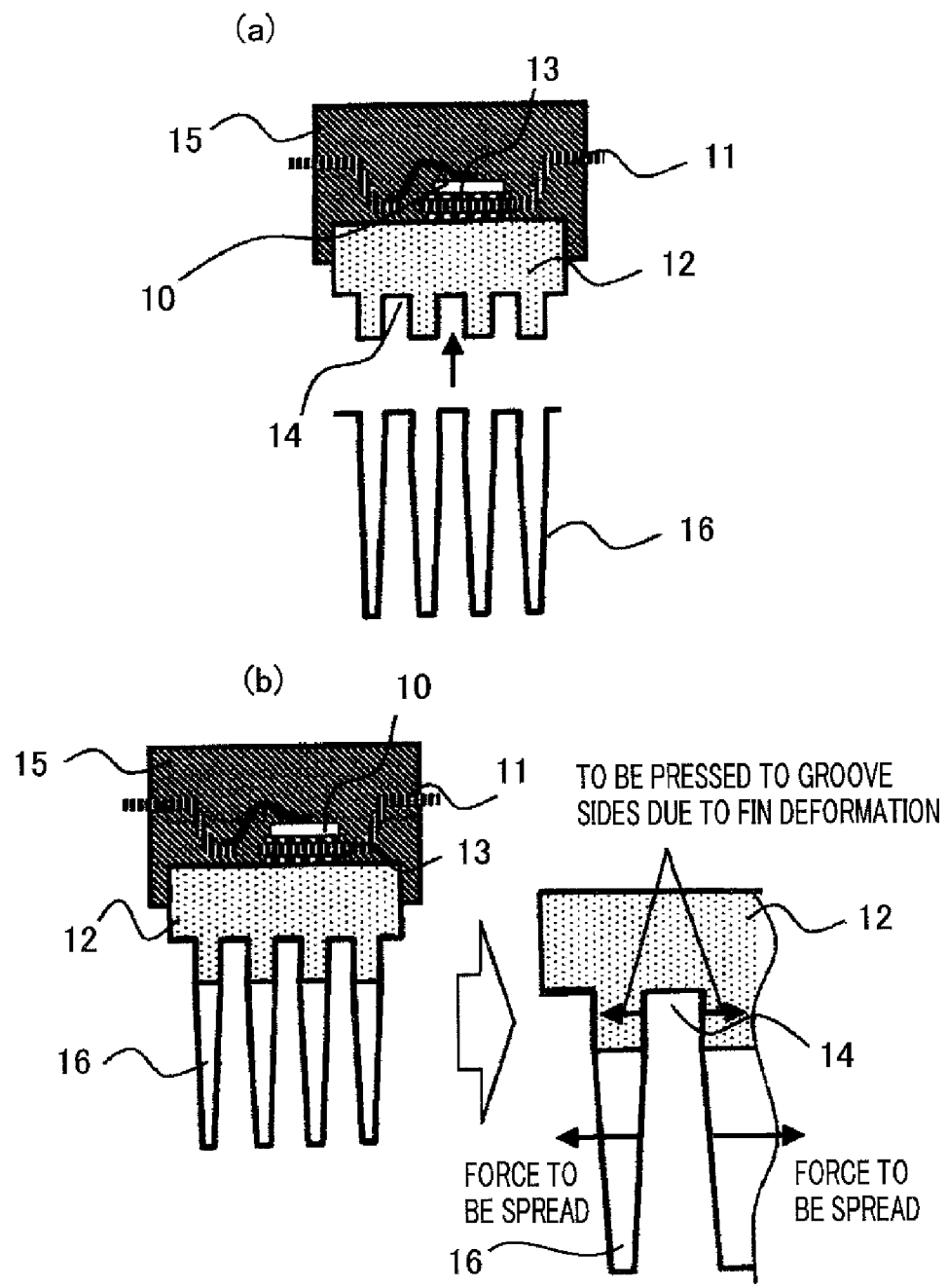
FIG. 1 are cross-sectional typical views each showing a power semiconductor circuit device according to an embodiment 1 of the present invention.

FIG. 1 are cross-sectional typical views each showing a power semiconductor circuit device according to an embodiment 1 of the present invention. In FIG. 1, a power semiconductor element 10 such as an insulated gate bipolar transistor (IGBT) or a metal oxide semiconductor field effect transistor (MOSFET) and a wiring member 11 mounted with the power semiconductor element 10 are bonded in a lump to abase board 12 made of aluminum with solder or an adhesive 13. The base board 12 is manufactured by extrusion or molding or die casting; and a groove 14 is preliminarily processed in a surface opposite to a surface on which the power semiconductor element 10 and the wiring member 11 mounted with the power semiconductor element 10 are mounted, that is, in a rear surface of the base board 12.

As shown in FIG. 1(a) or FIG. 1(b), the power semiconductor element 10, the wiring member 11 mounted with power semiconductor element 10, and the base board 12 are transfer molded with an epoxy based molding resin 15 so that the rear surface of the base board 12 and partial surfaces of the sides of the base board 12 are exposed.

A heat dissipating fin 16 is attached to the groove 14 processed in the rear surface of the base board 12. The heat dissipating fin 16 is configured by forming one pure aluminum based sheet member in a corrugated shape, and the heat dissipating fin 16 is made to be deformed; accordingly, as shown in FIG. 1(b), the heat dissipating fin 16 is attached to the groove 14 of the base board 12 by being joined by caulking. More specifically in detail, the power semiconductor element 10, the wiring member 11 mounted with the power semiconductor element 10, and the base board 12 are transfer molded with the epoxy based molding resin 15 so that the rear surface of the base board 12 and the partial surfaces of the sides of the base board 12 are exposed; and then, the heat dissipating fin 16 is joined by caulking to the groove 14 of the base board 12 as shown by an arrow in FIG. 1(a).

The power semiconductor circuit device according to the embodiment 1 is configured as described above; however, the power semiconductor element 10 may be provided with plural numbers, or the power semiconductor element 10 may be mounted on the base board 12 by directly bonding with solder or the adhesive 13 without via the wiring member 11. Further, in order to insulate from the base board 12, the power semiconductor element 10 and the wiring member 11 may be bonded to the base board 12 with solder or the adhesive 13 via an insulating member such as a ceramic substrate and the insulating member may be bonded to the base board 12.

The heat dissipating fin 16 to be attached by being joined by caulking to the groove 14 that is processed in the rear surface of the base board 12, may not be formed in the corrugated shape from one sheet, but may be individually formed for each sheet. Furthermore, attachment of the heat dissipating fin 16 to the base board 12 may be formed by caulking by deforming the base board 12, and it may be permissible as long as the attachment is joined by a pressing force between the both. Further, the heat dissipating fin 16 may be joined by caulking while heating the heat dissipating fin 16 at 100 to 150° C. and softening. Incidentally, in the shapes according to the present embodiment, as compared to the caulking performed at room temperature, in the case where the heat dissipating fin 16 is heated at 100 to 150° C., confirmation is made that the same caulking condition as in the caulking performed at room temperature can be achieved at a caulking pressure of approximately 70%.

Figure 2:
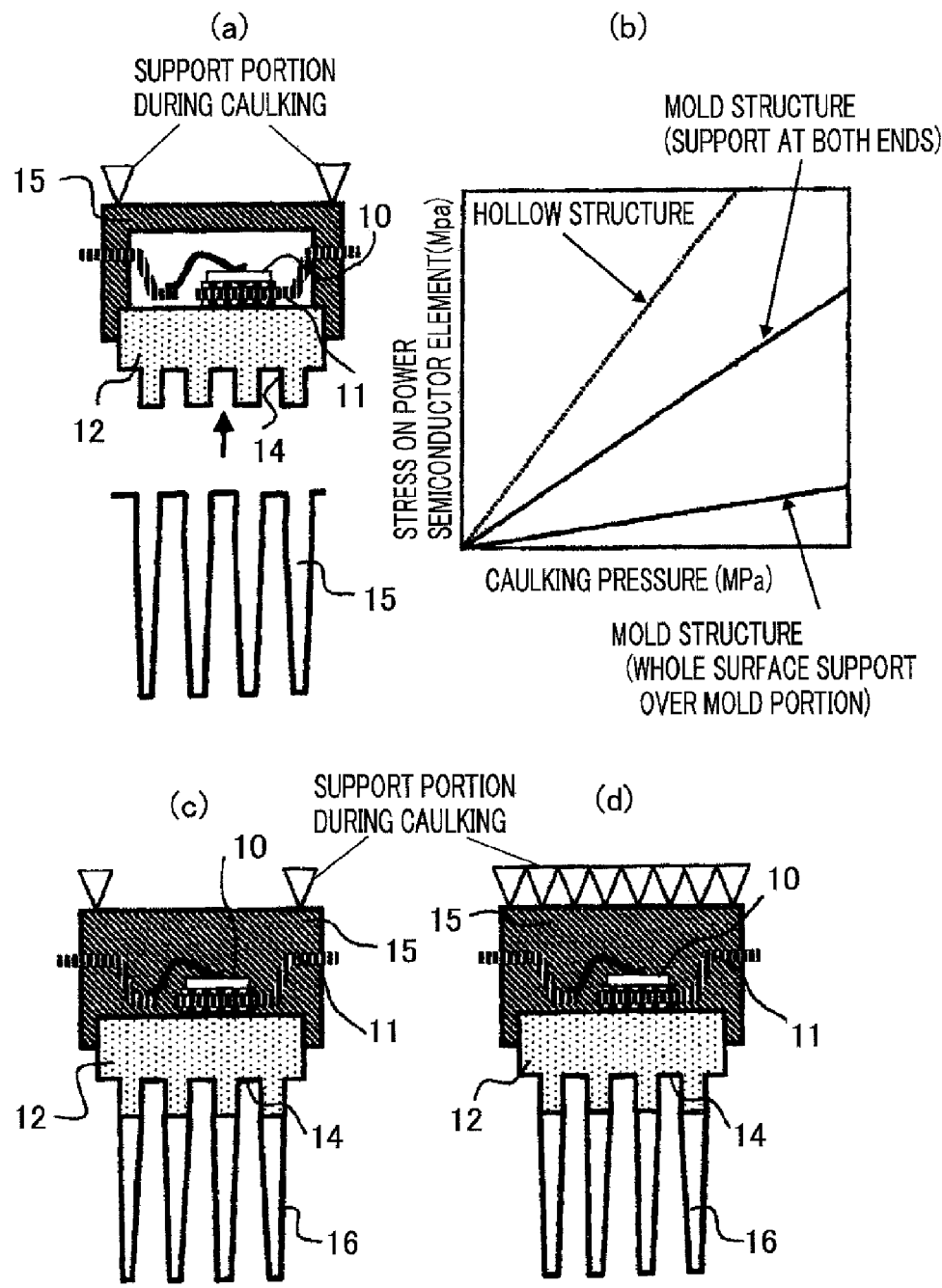
FIG. 2 are a view showing effect of reduction of stress generated on the power semiconductor element according to the embodiment 1 of the present invention, and views each showing conditions for use in estimating the effect of reduction and a cross-section of the power semiconductor circuit device.

Next, FIG. 2(b) shows a relationship between caulking pressure during caulking and stress generated on the power semiconductor element 10 in the cases of a structure in which the periphery of the power semiconductor element 10 is transfer molded with the epoxy based molding resin 15 without a gap as in the present embodiment and a hollow structure in which the periphery of the power semiconductor element 10 is hollowed or gel sealed as shown in FIG. 2(a). Incidentally, in FIG. 2(b), a lateral axis shows a caulking pressure (MPa), a longitudinal axis shows stress (MPa) generated on the power semiconductor element 10, and the caulking pressure is a pressure at which a caulking blade of the heat dissipating fin 16 presses the base board 12 during joining by caulking.

If the caulking pressure is the same, as compared to the hollow structure shown in FIG. 2(a), the transfer mold structure according to the present embodiment can reduce stress on the power semiconductor element 10 to approximately ½ in the case where a support structure during joining by caulking is supported at upper both ends of the molding resin 15 as shown in FIG. 2(c). Furthermore, as shown in FIG. 2(d), in the case of being supported by the upper whole surface of the molding resin 15, the stress on the power semiconductor element 10 can be reduced to not less than ¹⁄₁₀. Therefore, according to the transfer mold structure of the present embodiment, a caulking joint of the heat dissipating fin 16 to the base board 12, in which the stress is considerably small and there is no concern of damage to the power semiconductor element 10, can be formed.

Furthermore, the molding resin 15 is entered in a gap of the power semiconductor element 10; accordingly, the occurrence of stress concentration on the power semiconductor element 10 is prevented, breakdown strength of the power semiconductor element 10 is also increased, and damage to the power semiconductor element 10 is also difficult to occur against a large caulking pressure.

An epoxy based material is hard as a mold material and therefore the epoxy based material is preferable with regard to escape of damage to the power semiconductor element 10; a structure which molds the periphery of the power semiconductor element 10 with epoxy resin by a method such as a potting, transfer molding, or casting method, is good; and further, wherever possible, a flat structure is preferable as an upper surface so that the caulking pressure can be received over the whole mold surface.

On the other hand, a manufacturing process goes through: a process of mounting the power semiconductor element 10 on the wiring member 11, a process of mounting the wiring member 11 on the base board 12, a process of setting the wiring member 11 and the base board 12 on a molding die (not shown in the drawing) and molding the power semiconductor element 10, and a process of attaching the heat dissipating fin 16 to the base board 12; and accordingly, a problem such as degradation of productivity due to difficulties in the soldering process and the wire bond process and due to an increase in the circuit device, which have been problematic in the past because of the presence of the heat dissipating fin 16 since the beginning of the process, can be solved.

The power semiconductor element 10 and the wiring member 11 mounted with the power semiconductor element 10 are soldered or bonded in a lump to the base board 12 which can directly form the heat dissipating fin 16; accordingly, a grease portion which is usually used for joining the base board 12 and the heat dissipating fin 16 can be eliminated and high heat dissipation of the power semiconductor circuit device can be achieved.

Further, the heat dissipating fin 16 is joined by caulking to the base board 12; and therefore, it becomes easy to manufacture without a tooling change of equipment by changing the height and width of the heat dissipating fin 16 in accordance with heat dissipation specifications of the power semiconductor circuit device.

In the case where the heat dissipating fin 16 is joined by caulking to the rear surface of the base board 12, a fin which is formed by processing a soft pure aluminum based sheet member in a corrugated shape and connecting a plurality of fins may be used. In this case, as shown in FIG. 1(b), adjacent heat dissipating fins 16 are pulled toward each other and force to be pressed to the groove 14 formed in the base board 12 is generated; and therefore, large strength and low thermal resistance can be obtained without largely deforming the base board 12. Therefore, a considerably excellent joint of the heat dissipating fin 16 to the base board 12, which does not further cause damage to the power semiconductor circuit device including the power semiconductor element 10, can be achieved. Particularly, a pitch of the fins of the heat dissipating fin 16 is set slightly smaller than a pitch of the groove 14 formed in the base board 12; and accordingly, pressing force of the heat dissipating fin 16 to the sides of the groove 14 formed in the base board 12 can be further increased.

Furthermore, in order to expose the rear surface of the base board 12 and the partial surfaces of the sides of the base board 12, a pressing unit which presses the periphery of the base board 12 during flowing of resin is provided on the periphery of a molding die (not shown in the drawing), where the base board 12 is arranged. The pressing unit is provided; accordingly, a burr of the molding resin 15 is prevented from being generated due to flowing of the resin from a gap of the die, and the caulking joint can be formed without generating an increase in thermal resistance and a decrease in joint strength at a joint portion, both of which are caused by the burr of the molding resin 15 generated at the joint portion.

Embodiment 2

Figure 3:
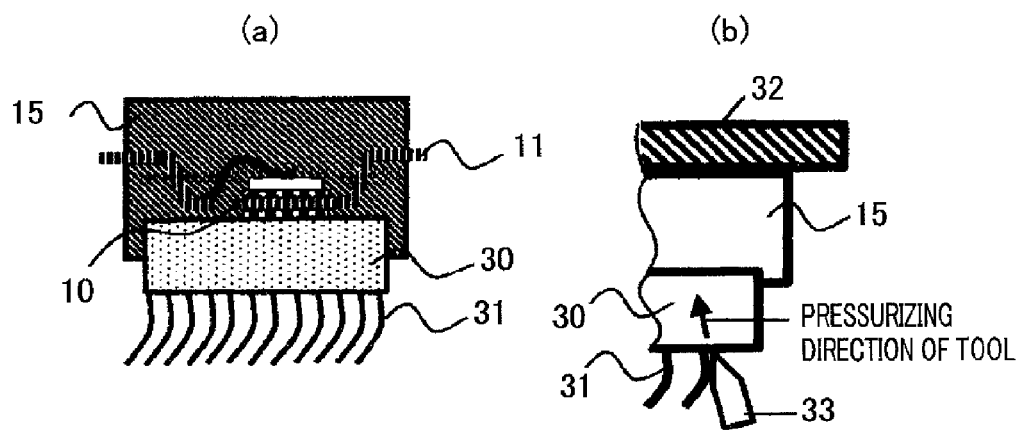
FIG. 3 are a cross-sectional typical view showing a power semiconductor circuit device according to an embodiment 2 of the present invention, and a typical view when a heat dissipating fin is raised up.

Next, a power semiconductor circuit device and a method for manufacturing the same according to an embodiment 2 of the present invention will be described with reference to FIG. 3.

In the power semiconductor circuit device according to the embodiment 2, a power semiconductor element 10 and a wiring member 11 mounted with the power semiconductor element 10 are soldered or bonded in a lump to a base board 30 made of aluminum, as in the embodiment 1. Furthermore, as shown in FIG. 3(a), the power semiconductor element 10, the wiring member 11 mounted with the power semiconductor element 10, and the base board 30 are transfer molded with an epoxy based molding resin 15 so that a rear surface of the base board 30 and partial surfaces of the sides of the base board 30 are exposed.

As for the base board 30, a surface opposite to a surface on which the power semiconductor element 10 and the wiring member 11 mounted with the power semiconductor element 10 are mounted, that is, the rear surface of the base board 30 is processed in a plane. A heat dissipating fin 31 is formed on the rear surface processed on the plane of the base board 30. As shown in FIG. 3(b), a pressing jig 32 is brought into contact with a surface of the molding resin 15 and the rear surface of the base board 30 is raised up by a tool 33 or the like; accordingly, the heat dissipating fin 31 is formed. Incidentally, the heat dissipating fin 31 may be formed onside portions of the base board 30, the side portions being exposed from the molding resin 15.

In the case of manufacturing the power semiconductor circuit device according to the embodiment 2, when the rear surface of the base board 30 is raised up by the tool 33 or the like, force is applied in a direction for pressing the power semiconductor element 10; however, stress generated on the power semiconductor element 10 can be reduced by supporting an upper surface of the molding resin 15 with the pressing jig 32 or the like as shown in FIG. 2(a) or FIG. 2(c). Furthermore, the heat dissipating fin 31 is formed later; and accordingly, a problem such as degradation of productivity due to difficulties in the soldering process and the wire bond process or due to taking up much space, which have been problematic in the past because of the presence of the heat dissipating fin 31 in advance, can be solved.

Furthermore, the heat dissipating fin 31 can be formed at normal temperature; a narrower pitch can be achieved as compared to the case of forming the heat dissipating fin 31 by being joined by caulking; and the heat dissipating fin 31 is raised up from the base board 30 and therefore the base board 30 does not need to be preliminarily processed. In addition, even when a burr during molding is occurred on a surface where the heat dissipating fin 31 is formed, the burr is also peeled off by the tool together with the raising up process; and therefore, the burr does not cause degradation of thermal resistance.

Further, the thermal resistance between the heat dissipating fin 31 and the base board 30 is lower as compared to the caulking joint and the pitch and height of the heat dissipating fin 31 can be changed in accordance with heat dissipation specifications of the power semiconductor circuit device without a tooling change of equipment; and therefore, low thermal resistance and improvement in productivity can be achieved by forming the heat dissipating fin 31 later.

Embodiment 3

Figure 4:
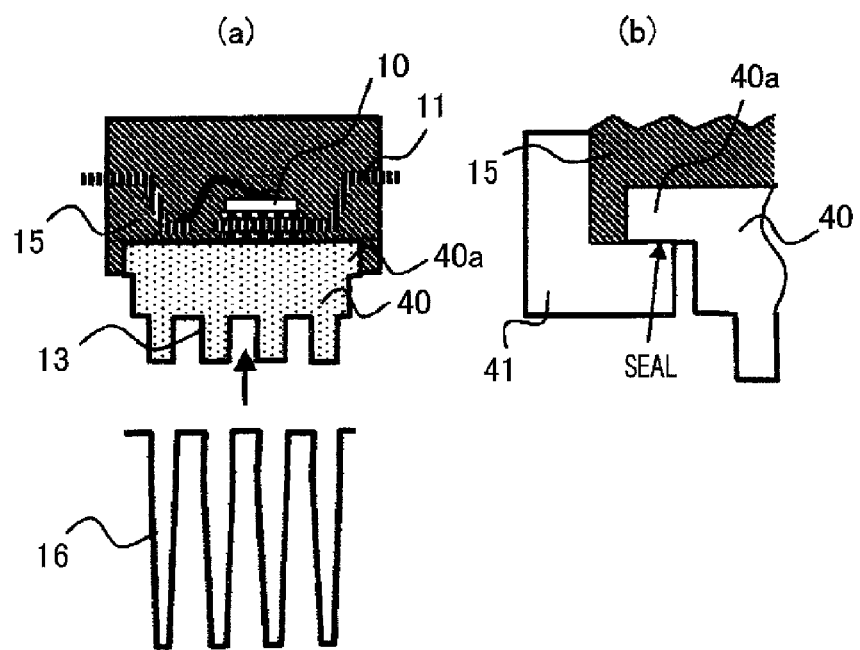
FIG. 4 are a cross-sectional typical view showing a power semiconductor circuit device according to an embodiment 3 of the present invention, and a view representing a positional relationship between a molding die and a base board during molding.

Next, a power semiconductor circuit device and a method for manufacturing the same according to an embodiment 3 of the present invention will be described with reference to FIG. 4.

In the power semiconductor circuit device according to the embodiment 3, as in the embodiment 1 or the embodiment 2, as shown in FIG. 4(a), a power semiconductor element 10, a wiring member 11 mounted with the power semiconductor element 10, and a base board 40 are transfer molded with an epoxy based molding resin 15 so that a rear surface of the base board 40 and partial surfaces of the sides of the base board 40 are exposed.

As for the base board 40, amounting surface on which the power semiconductor element 10 and the wiring member 11 mounted with the power semiconductor element 10 are mounted is formed in a rectangular shape, and a stair portion 40a is formed in each of four directions of the sides by machining. Then, as shown in FIG. 4(b), a lower surface of the stair portion 40a is molded in a sealable manner by being pressed with a molding die 41. Incidentally, other configuration is the same as the embodiment 1; therefore, the same reference numerals are given and their description will not be repeated.

In the case where a heat dissipating fin 16 is joined by caulking to a groove 14, when positional deviation between the heat dissipating fin 16 and the groove 14 is large, the caulking joint cannot be formed; and therefore, positioning of the heat dissipating fin 16 and the groove 14 becomes important. Typically, molding is performed by being positioned with the molding die 41 using a pilot hole or the like of the wiring member; however, in the power semiconductor circuit device of the embodiment 3, the wiring member 11 is joined to the base board 40 and therefore positional deviation between the wiring member 11 and the base board 40 is not small. Even in such a case, the base board 40 is positioned at the stair portion 40a formed in the base board 40; accordingly, the heat dissipating fin 16 is easily positioned during post-processing.

Furthermore, the lower surface of the stair portion 40a is pressed and sealed; accordingly, flowing of the molding resin 15 to a caulking joint portion can be prevented at the stair portion 40a and the burr of the mold can be eliminated by preventing the molding resin 15 from flowing to the caulking joint portion; and therefore, formation of the heat dissipating fin 16 becomes easy.

Embodiment 4

Next, a power semiconductor circuit device and a method for manufacturing the same according to an embodiment 4 of the present invention will be described.

Figure 5:
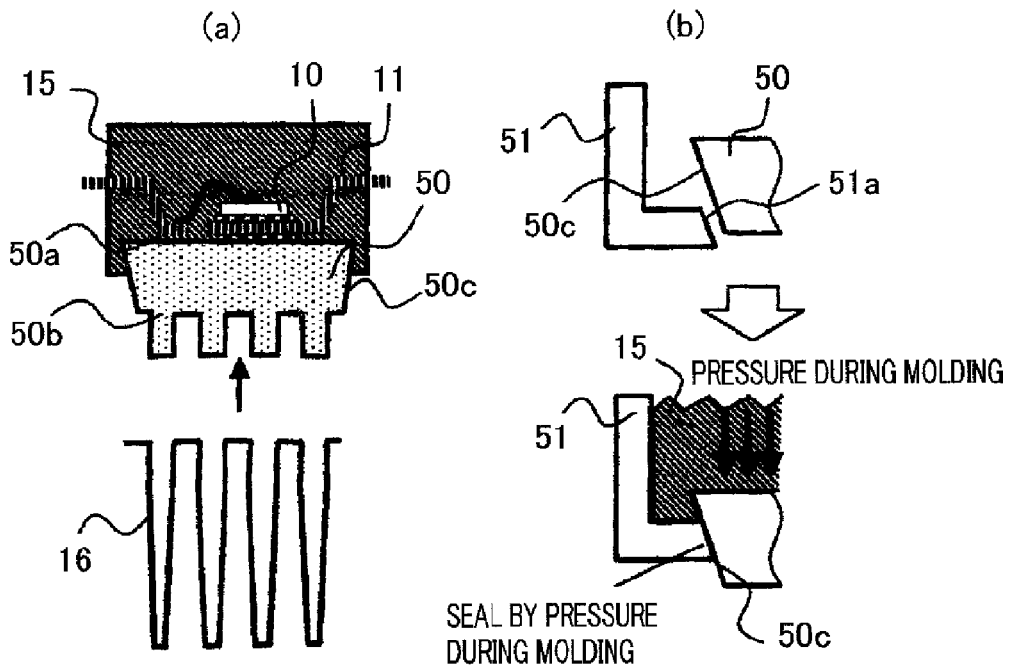
FIG. 5 are a cross-sectional typical view showing a power semiconductor circuit device according to an embodiment 4 of the present invention, and a view representing a positional relationship between a molding die and a base board during molding.

In the power semiconductor circuit device according to the embodiment 4, as in the above mentioned respective embodiments, as shown in FIG. 5(a), a power semiconductor element 10 and a wiring member 11 mounted with the power semiconductor element 10 are mounted on a base board 50. An inclined portion 50c is provided on each of the sides of the base board 50 so that a surface of the baseboard 50, the surface being opposite to a mounting surface on which the power semiconductor element 10 and the wiring member 11 mounted with the power semiconductor element 10 are mounted, that is, a rear surface 50b of the base board 50 is smaller than the mounting surface on which the power semiconductor element 10 and the wiring member 11 mounted with the power semiconductor element 10 are mounted, that is, a surface 50a of the base board 50. Then, an inclined portion 51a serving as a unit which presses and seals the inclined portion 50c of the base board 50 during molding is formed in a molding die 51. The inclined portion 50c may be substituted for the stair portion described in FIG. 4(b) of the embodiment 3. Incidentally, other configuration is the same as the embodiment 1; therefore, the same reference numerals are given and their description will not be repeated.

As described above, the power semiconductor circuit device according to the embodiment 4 is provided with the inclined portion 50c on each side of the base board 50, so that the heat dissipating fin 16 side is smaller than the mounting surface side on which the power semiconductor element 10 and the wiring member 11 mounted with the power semiconductor element 10 are mounted; the inclined portion 50c is pressed by the inclined portion 51a of the molding die 51 by a pressure to be applied during a molding process; and accordingly, the resin is sealed by a simple die structure and a burr due to the mold can be eliminated.

Embodiment 5

Next, a power semiconductor circuit device and a method for manufacturing the same according to an embodiment 5 of the present invention will be described.

Figure 6:
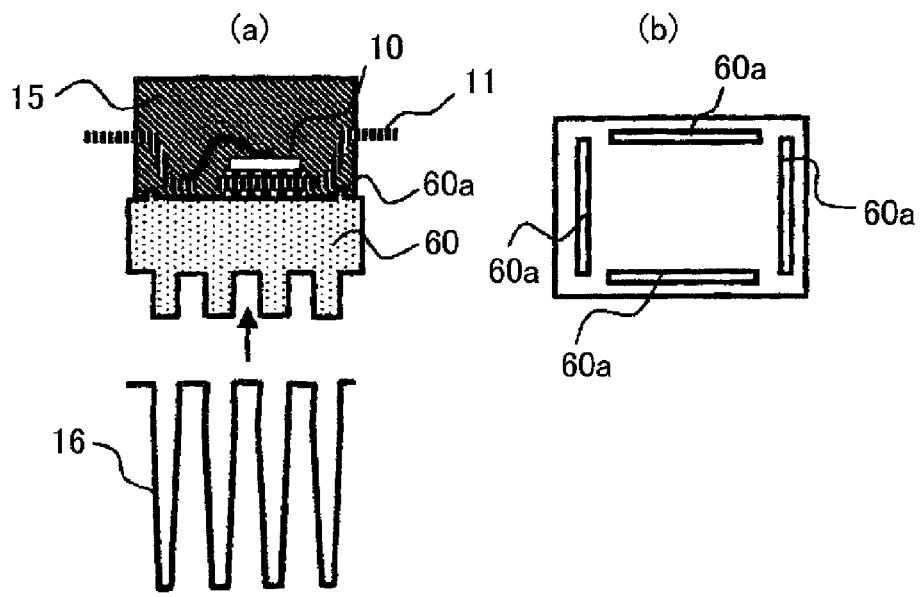
FIG. 6 are a cross-sectional typical view showing a power semiconductor circuit device according to an embodiment 5 of the present invention, and a view showing a shape and arrangement of convex portions seen from an upper surface of a base board.

In the power semiconductor circuit device according to the embodiment 5, as shown in FIGS. 6(a), (b), a surface of a base board 60, that is, a mounting surface on which a power semiconductor element 10 and a wiring member 11 mounted with the power semiconductor element 10 are mounted, is formed with convex portions 60a each perpendicular to the mounting surface. The convex portions 60a are each provided at a slightly inner side from an end portion of each side of the base board 60, and are molded with a molding resin 15 so as to include the convex portions 60a as shown in FIG. 6(a). Furthermore, an area of the surface of the base board 60 is larger than a project area of a molding portion by the molding resin 15, and the sides of the molding resin 15 are located outside outermost end positions of a heat dissipating fin 16. The convex portion 60a formed on the base board 60 may be a concave portion. Incidentally, other configuration is the same as the embodiment 1; therefore, the same reference numerals are given and their description will not be repeated.

According to the power semiconductor circuit device of the embodiment 5, a burr of the molding resin 15 on formation portions of the heat dissipating fin 16 of the power semiconductor circuit device can be eliminated.

Furthermore, when aluminum is used for the base board 60, the molding resin 15 does not have good adhesiveness with the aluminum and therefore the molding resin 15 is easy to peel off. However, the convex portions 60a are formed; accordingly, adhesive force of the molding resin 15 is increased against the base board 60, and the molding resin 15 can be prevented from being peeled off by stress in forming the heat dissipating fin 16.

Embodiment 6

Figure 7:
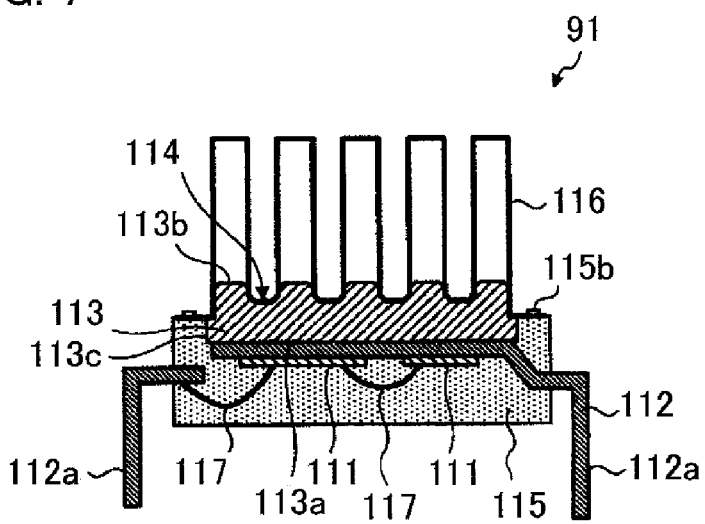
FIG. 7 is a front longitudinal sectional view showing a power module according to an embodiment 6 of the present invention.
Figure 8:
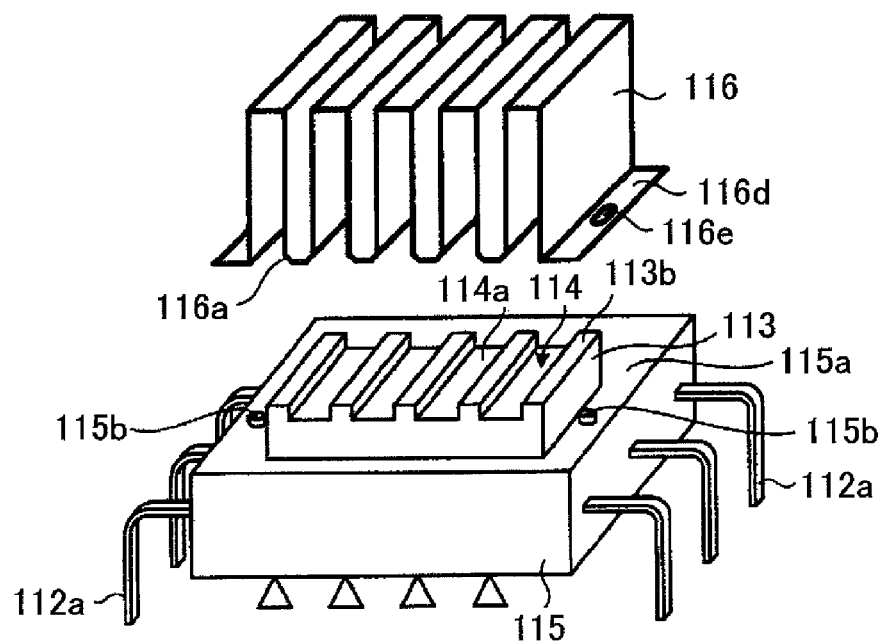
FIG. 8 is an exploded perspective view of the power module of the embodiment 6 of the present invention.
Figure 9:
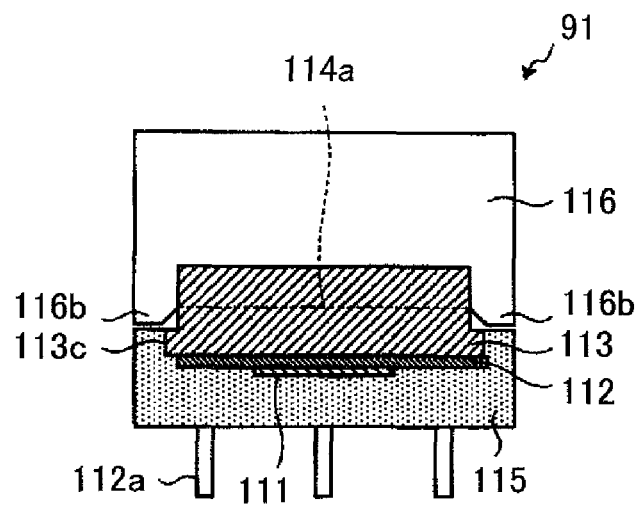
FIG. 9 is a side longitudinal sectional view of the power module of the embodiment 6 of the present invention.
Figure 10:
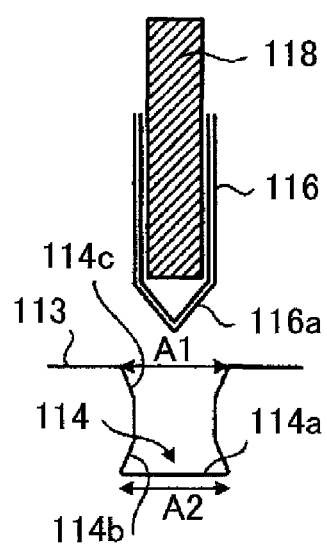
FIG. 10 is a longitudinal sectional view showing shapes of a groove of a metal base and a sheet metal heat dissipating fin in an embodiment of the present invention.
Figure 11:
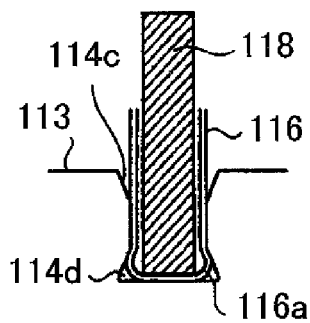
FIG. 11 is a longitudinal sectional view showing a state where a caulking portion of the sheet metal heat dissipating fin is joined by caulking in the groove of the metal base in the embodiment of the present invention.
Figure 12:
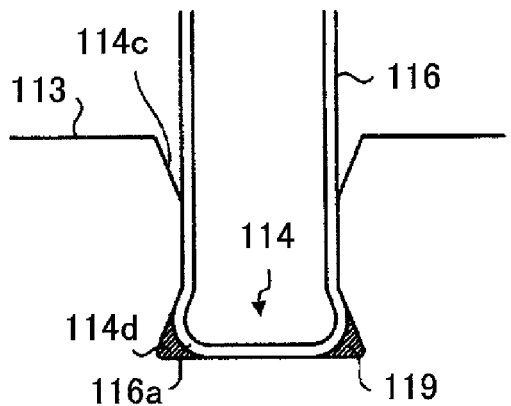
FIG. 12 is a longitudinal sectional view showing a state where a high thermally conductive adhesive is filled in a gap between the groove of the metal base and the sheet metal heat dissipating fin in the embodiment of the present invention.

FIG. 7 is a front longitudinal sectional view showing a power module serving as a power semiconductor circuit device in an embodiment 6 of the present invention; FIG. 8 is an exploded perspective view of the power module of the embodiment 6; FIG. 9 is a side longitudinal sectional view of the power module of the embodiment 6; FIG. 10 is a longitudinal sectional view showing shapes of a groove of a metal base and a sheet metal heat dissipating fin; FIG. 11 is a longitudinal sectional view showing a state where a caulking portion of the sheet metal heat dissipating fin is joined by caulking in the groove of the metal base; and FIG. 12 is a longitudinal sectional view showing a state where a high thermally conductive adhesive is filled in a gap between the groove of the metal base and the sheet metal heat dissipating fin.

As shown in FIG. 7 to FIG. 12, a power module 91 of the embodiment 6 includes a power semiconductor element 111 which generates heat, a metal frame 112 which is mounted with the power semiconductor element 111 and has an electrode terminal 112a, a metal base 113 on which the metal frame 112 is located on one surface 113a and a plurality of parallel grooves 114 are formed in the other surface 113b, a molding resin 115 which coats the power semiconductor element 111 and the metal frame 112 and covers the one surface 113a of the metal base 113 and an outer peripheral portion 113c on the one surface 113a side, and a sheet metal heat dissipating fin 116 which is plastically deformed so that a caulking portion 116a folded and formed in a substantially V shape is crushed to be joined by caulking in the groove 114 and so that a protruded portion 116b from the groove 114 of the caulking portion 116a is located at a position lower than a bottom surface 114a of the groove 114.

As the power semiconductor element 111, there are a diode of a converter section which converts input alternating current (AC) electric power to direct current (DC), a bipolar transistor of an inverter section which converts DC to AC, an IGBT, a MOSFET, a gate turnoff thyristor (GTO), and the like.

The power semiconductor elements 111, and the power semiconductor element 111 and the electrode terminal 112a are electrically connected by a metal wire 117, respectively. The metal base 113 is formed of aluminum, copper, or the like with high thermal conductivity.

The power semiconductor element 111 and the metal frame 112, and the metal frame 112 and the metal base 113 are joined by soldering, respectively; and the sheet metal heat dissipating fin 116 has potential. Solder with high thermal conductivity is used for joints from the power semiconductor element 111 to the metal base 113; therefore, heat dissipation property is high even in a small area and the power semiconductor element 111 can be reduced in size.

A corrugated heat dissipating fin in which one belt-like thin metal sheet such as aluminum is formed in a corrugated shape (rectangular wave shape) by folding a plurality of times is used for the sheet metal heat dissipating fin 116 of the embodiment 6. The corrugated heat dissipating fin 116 is suitable for joining by caulking to the metal base 113 by a one-time caulking process; however, a sheet metal heat dissipating fin 116 in which one belt-like metal sheet is folded one time in the substantially V shape may be used in place of the corrugated heat dissipating fin 116.

As the molding resin 115, thermosetting resin such as epoxy resin is used. Thermoplastic resin such as polyphenylene sulfide (PPS) and polybutylene terephthalate (PBT) may be used. In order to easily perform positioning of the corrugated heat dissipating fin 116 when being joined by caulking to the metal base 113, a projection 115b is provided at an edge portion of a surface 115a on the fin side of the molding resin 115, and the projection 115b is fit and fixed into a hole 116e provided in a side flange 116d of the corrugated heat dissipating fin 116. The projection 115b contributes to suppress positional deviation of the sheet metal heat dissipating fin 116 after being joined by caulking to the groove 114.

As a method for manufacturing the power module 91, there is a method in which the sheet metal heat dissipating fin 116 is joined by caulking to the metal base 113 in advance; and in a post-process, the power semiconductor element 111, the metal wire 117, and the metal frame 112 are mounted on one surface 113a of the metal base 113 and are coated with the molding resin 115. However, in order to eliminate a tooling change in a soldering process and a resin molding process, the tooling change being generated when the sheet metal heat dissipating fin 116 to be attached to the metal base 113 is different in length, and in order to simplify the manufacturing process, the sheet metal heat dissipating fin 116 is preferably joined by caulking to the metal base 113 after the power semiconductor element 111, the metal wire 117, the metal frame 112, and the metal base 113 are molded with resin, as shown in FIG. 8.

That is, the power module 91 of the embodiment 6 is preferably manufactured by: a process of mounting the power semiconductor element 111 on the metal frame 112; a process of locating the metal frame 112 on one surface 113a of the metal base 113 in which a plurality of parallel grooves 114 are formed in the other surface 113b; a process of coating the power semiconductor element 111 and the metal frame 112, and covering the one surface 113a and the outer peripheral portion 113c on the one surface 113a side of the metal base 113, with the molding resin 115; and a process of plastically deforming so that the caulking portion 116a folded and formed in the substantially V shape of the sheet metal heat dissipating fin 116 is crushed to be joined by caulking in the groove 114 and so that the protruded portion 116b from the groove 114 of the caulking portion 116a is located at a position lower than the bottom surface 114a of the groove 114.

As shown in FIG. 8, the joint between the sheet metal heat dissipating fin 116 and the metal base 113 is fixed such that a flat portion (portion displayed by AA in FIG. 8) of an outer surface of the molding resin 115 is fixed on a board, a load of a press or the like is applied to the caulking portion 116a of the sheet metal heat dissipating fin 116, and the caulking portion 116a is plastically deformed to be joined by caulking.

At this time, even when a convex portion due to mounting of a large component such as a shunt and a concave portion which is for efficiently flowing the molding resin are present on the flat portion of the molding resin 115, a relief jig is used so as not to apply a load to the concave and convex portions; and accordingly, the caulking joint can be formed.

Next, the shape of the sheet metal heat dissipating fin 116 after being joined by caulking will be described with reference to FIG. 9. The lateral width of the sheet metal heat dissipating fin 116 is formed larger than the lateral width of the metal base 113, and both side edge portions of the sheet metal heat dissipating fin 116 are protruded from the groove 114.

When plastic deformation is performed so that the caulking portion 116a folded and formed in the substantially V shape of the sheet metal heat dissipating fin 116 is crushed to be joined by caulking in the groove 114 of the metal base 113, the protruded portions 116b from the groove 114 of the caulking portion 116a are not crushed; and therefore, the protruded portions 116b are displaced to positions lower than the bottom surface 114a of the groove 114. Accordingly, the protruded portions 116b from the groove 114 are caught at both ends of the groove 114; and consequently, even when vibration or the like is applied to the sheet metal heat dissipating fin 116, the sheet metal heat dissipating fin 116 is not slid along the groove 114 and is not misaligned.

Next, details of a cross-sectional shape of the groove 114 of the metal base 113 and a cross-sectional shape of the caulking portion 116a of the sheet metal heat dissipating fin 116 will be described with reference to FIG. 10 to FIG. 12.

When the caulking portion 116a of the sheet metal heat dissipating fin 116 is joined by caulking to the groove 114 of the metal base 113 by a pressing blade 118, the power semiconductor element 111 mounted on the metal base 113 is likely to be damaged by the occurrence of stress due to deformation of the metal base 113; and therefore, the caulking joint needs to be formed by a certain amount of low pressing load at which the power semiconductor element 111 is not damaged.

As shown in FIG. 10, the caulking portion 116a of the sheet metal heat dissipating fin 116 is folded and formed in the substantially V shape. A tapered surface 114c widened toward an opening portion and a reverse tapered surface 114b widened toward a bottom portion are formed in the groove 114 of the metal base 113.

A width A1 of the opening portion of the groove 114 and a width A2 of the bottom surface 114a are substantially the same. Furthermore, a taper angle of the caulking portion 116a of the sheet metal heat dissipating fin 116 and a taper angle of the tapered surface 114c of the groove 114 are substantially the same.

Therefore, the amounts of thermal expansion of the width A1 of the opening portion and the width A2 of the bottom surface 14a are substantially the same; thermal stresses of the tapered surface 114c and the reverse tapered surface 114b are substantially the same; and thermal reliability is high.

The caulking portion 116a is joined by caulking in the groove 114 so that the caulking portion 116a folded and formed in the substantially V shape is crushed by the pressing blade 118.

In the metal base 113, the other surface 113b is warped so as to be a convex surface due to thermal contraction of resin after molding and thus a pitch of the groove 114 is widened. More particularly, displacement of the grooves 114 at both ends is large; and when the sheet metal heat dissipating fin 116 is inserted, insertion becomes difficult because of being interfered with the groove 114. However, the caulking portion 116a is the substantially V shape and the opening portion of the groove 114 is the tapered surface 114c; and therefore, insertion of the caulking portion 116a is easy. Furthermore, the substantially V shaped caulking portion 116a is high in deformation capacity; and even when the metal base 113 is warped, the caulking joint can be sufficiently formed.

As shown in FIG. 11, the substantially V shaped caulking portion 116a is crushed by the pressing blade 118, is pressed into corners of the reverse tapered surfaces 114b of the bottom portion of the groove 114, and is joined by caulking. After being joined by caulking, a gap 114d is generated at each of the corners of the groove 114. The reverse tapered surface 114b of the bottom portion of the groove 114 facilitates the caulking portion 116a to go into the groove 114 and therefore the caulking joint can be formed by a low pressing load.

Furthermore, if the sheet metal heat dissipating fin 116 is heated during joining by caulking, bending elasticity of the sheet metal heat dissipating fin 116 is reduced; and thus, a strong caulking joint can be formed without giving stress to the power semiconductor element 111.

As shown in FIG. 12, a high thermally conductive adhesive 119 may be filled in the gap 114d between the groove 114 of the metal base 113 and the sheet metal heat dissipating fin 116 joined by caulking in the groove 114. As the high thermally conductive adhesive 119, one in which a filler is added to soft silicon resin to achieve high thermal conductivity is used.

The high thermally conductive adhesive 119 is filled in the gap 114d and accordingly heat dissipation property of the power module 91 is improved. Furthermore, the sheet metal heat dissipating fin 116 and the metal base 113 are bonded with the high thermally conductive adhesive 119 and accordingly the sheet metal heat dissipating fin 116 is not misaligned even under severe vibration conditions.

The cross-sectional shape of the groove 114 of the metal base 113 has been described above in detail; however, the groove 114 may be a simple rectangular shape which is not provided with the tapered surface 114c and the reverse tapered surface 114b.

Furthermore, the high thermally conductive adhesive 119 may not be filled in the gap 114d.

The power module 91 of the embodiment 6 forms a metal joint with high thermal conductivity from the power semiconductor element 111 serving as a heating element to the sheet metal heat dissipating fin 116 by the above described structure; accordingly, heat dissipation property is increased, the expensive power semiconductor element 111 is reduced in size, and cost is reduced. Furthermore, after the resin molding process, the sheet metal heat dissipating fin 116 is joined by caulking to the metal base 113; therefore, a power module in which the length of the fin is different can also be easily manufactured, workability can be improved, and manufacturing cost can be reduced.

In addition, the protruded portions 116b from the groove 114 of the caulking portion 116a are displaced to the positions lower than the bottom surface 114a of the groove 114; therefore, the protruded portions 116b are caught at both ends of the groove 114; and accordingly, even when vibration or the like is applied to the sheet metal heat dissipating fin 116, the sheet metal heat dissipating fin 116 is not slid along the groove 114 and is not misaligned.

Embodiment 7

Figure 13:
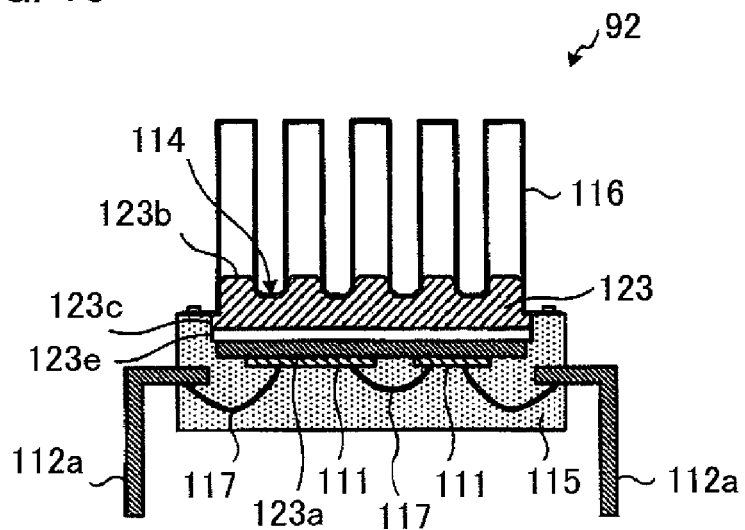
FIG. 13 is a front longitudinal sectional view showing a power module according to an embodiment 7 of the present invention.

FIG. 13 is a front longitudinal sectional view showing a power module according to an embodiment 7 of the present invention.

The difference between a power module 92 of the embodiment 7 and the power module 91 of the embodiment 6 is that a metal substrate 123 is substituted for the metal frame 112 and the metal base 113 of the embodiment 6.

That is, the power module 92 of the embodiment 7 includes a power semiconductor element 111 which generates heat; the metal substrate 123 in which the power semiconductor element 111 is mounted on one surface 123a, a plurality of parallel grooves 114 are formed in the other surface 123b, and an insulating layer 123e made of resin is formed between the one surface 123a and the other surface 123b; a molding resin 115 which coats the power semiconductor element 111 and covers the one surface 123a and an outer peripheral portion 123c on the one surface 123a side of the metal substrate 123; and a sheet metal heat dissipating fin 116 which is plastically deformed so that a caulking portion 116a folded and formed in a substantially V shape is crushed to be joined by caulking in the groove 114 and so that a protruded portion 116b from the groove 114 of the caulking portion 116a is located at a position lower than a bottom surface 114a of the groove 114.

Furthermore, the power module 92 of the embodiment 7 is preferably manufactured by: a process of mounting the power semiconductor element 111 on the one surface 123a of the metal substrate 123 in which the insulating layer 123e is formed between the other surface 123b in which the plurality of parallel grooves 114 are formed and the one surface 123a; a process of coating the power semiconductor element 111, and covering the one surface 123a and the outer peripheral portion 123c on the one surface 123a side of the metal substrate 123, with the molding resin 115; and a process of plastically deforming so that the caulking portion 116a folded and formed in the substantially V shape of the sheet metal heat dissipating fin 116 is crushed to be joined by caulking in the groove 114 and so that the protruded portion from the groove 114 of the caulking portion 116a is located at a position lower than the bottom surface 114a of the groove 114.

The power semiconductor elements 111, and the power semiconductor element 111 and an electrode terminal 112a held by the molding resin 115 are electrically connected by a metal wire 117, respectively. The metal substrate 123 is formed of aluminum, copper, or the like with high thermal conductivity.

The metal substrate 123 has the resin insulating layer 123e and therefore thermal conductivity is lower than a soldered joint; however, the metal substrate 123 is insulated by the resin insulating layer 123e and therefore a plurality of power semiconductor elements 111 can be mounted next to each other.

In the case of using as an inverter, the power module 91 of the embodiment 6 is not insulated and therefore a plurality of the power modules 91 need to be disposed while providing a spatial insulation distance for each circuit; however, since the power module 92 of the embodiment 7 is insulated for each circuit, the spatial insulation distance does not need to be provided and reduction in size can be achieved.

Furthermore, the insulating layer 123e is a resin material and low in coefficient of elasticity; therefore, stress generated on the power semiconductor element 111 is small and damage of the power semiconductor element 111 due to warpage of the metal substrate 123 generated when the sheet metal heat dissipating fin 116 is joined by caulking to the metal substrate 123, can be prevented.

INDUSTRIAL APPLICABILITY

A power semiconductor circuit device (power module) according to the present invention is useful for a power converter such as an inverter and a converter.

DESCRIPTION OF REFERENCE NUMERALS 10, 111 Power semiconductor element (Power semiconductor element), 11 Wiring member, 12, 30, 40, 50, and Base board, 13 Solder or Adhesive, 14 and 114 Groove, 15 and 115 Molding resin, 16 and 31 Heat dissipating fin, 32 Pressing jig, 33 Tool, 40a Stair portion, 41 and 51 Molding die, 50a Surface, 50b Rear surface, 50c and 51a Inclined portion, 60a Convex portion, 91 and 92 Power module, 112 Metal frame, 112a Electrode terminal, 113 Metal base, 113a One surface, 113b Other surface, 113c Outer peripheral portion, 114a Bottom surface, 114b Reverse tapered surface, 14c Tapered surface, 114d Gap, 115a Surface on fin side, 115b Projection, 116 Sheet metal heat dissipating fin (Corrugated heat dissipating fin), 116a Caulking portion, 116b Protruded portion from groove, 116d Side flange, 116e Hole, 117 Metal wire, 118 Pressing blade, 119 High thermally conductive adhesive, 123 Metal substrate, 123a One surface, 123b Other surface, 123c Outer peripheral portion, 123e Insulating layer (Resin insulating layer)

The invention claimed is:

1. A power semiconductor circuit device equipped with a power semiconductor element, said device comprising:
    a base board including one surface of which at least said power semiconductor element is mounted, and a plurality of grooves for joining are formed in an opposite surface of said base board;
    a resin which molds said base board and said power semiconductor element in a state where the base board surface opposite to the surface on which said power semiconductor element is mounted and at least partial surfaces of sides of the base board, are exposed so as to expose said grooves; and
    a plurality of heat dissipating fins joined to said base board by a pressing force after molding by said resin,
    wherein said molding by said resin is molded by a die having a unit which presses a periphery of said base board, and
    said plurality of heat dissipating fins being fixed by caulking to said plurality of grooves.

2. The power semiconductor circuit device according to claim 1,
    wherein said heat dissipating fin is formed in a corrugated shape from one sheet.

3. The power semiconductor circuit device according to claim 1,
    wherein the groove formed in said base board is formed with a tapered surface widened toward an opening portion and a reverse tapered surface widened toward a bottom portion.

4. The power semiconductor circuit device according to claim 1,
    further comprising a high thermally conductive adhesive which is filled in a gap between the groove of said base board and said heat dissipating fin fixed by caulking in the groove.

5. The power semiconductor circuit device according to claim 1,
    wherein at least opposite two surfaces of said base board are each formed with a stair-like step portion.

6. The power semiconductor circuit device according to claim 1,
wherein said base board is provided with inclined portions formed from the surface on which said power semiconductor element is mounted to the surface opposite to the surface on which said power semiconductor element is mounted.

7. The power semiconductor circuit device according to claim 1,
wherein an area of the base board surface on which said power semiconductor element is mounted is larger than a project area of a molding portion by said resin.

8. The power semiconductor circuit device according to claim 1,
wherein the base board surface on which said power semiconductor element is mounted is formed with vertical convex portions or concave portions.

9. The power semiconductor circuit device according to claim 1,
wherein said heat dissipating fin has a caulking portion folded and formed in a V shape, and is plastically deformed so that the caulking portion is crushed to be fixed by caulking in the groove and so that a protruded portion from the groove of the caulking portion is located at a position lower than a bottom surface of the groove.

10. A method for manufacturing a power semiconductor circuit device equipped with a power semiconductor element, said method comprising:
mounting at least said power semiconductor element on one surface of a base board and forming a plurality of grooves which are for joining in an opposite surface of said base board;
molding said base board and said power semiconductor element in a state where partial surfaces of said base board, including the base board surface opposite to the surface on which said power semiconductor element is mounted and side surfaces, are exposed;
wherein said molding by said resin is molded by a die having a unit which presses a periphery of said base board, and then,
fixing a plurality of heat dissipating fins by caulking to the plurality of grooves of said base board.

11. The method for manufacturing the power semiconductor circuit device according to claim 10,
wherein the periphery of said base board is formed with a step portion or a tapered portion.

12. The method for manufacturing the power semiconductor circuit device according to claim 10,
wherein said heat dissipating fin is fixed by caulking to said base board while being heated.

13. A power semiconductor circuit device comprising:
a power semiconductor element which generates heat;
a metal substrate in which said power semiconductor element is mounted on one surface, a plurality of parallel grooves are formed in other surface, and an insulating layer is formed between the one surface and the other surface;
a molding resin which coats said power semiconductor element and covers the one surface and an outer peripheral portion on the one surface side of said metal substrate; and
a heat dissipating fin which has a caulking portion folded and formed in a V shape, and is plastically deformed so that the caulking portion is crushed to be fixed by caulking in the groove and so that a protruded portion from the groove of the caulking portion is located at a position lower than a bottom surface of the groove.

14. A method for manufacturing a power semiconductor circuit device, comprising:
a step of mounting a power semiconductor element on a metal frame;
a step of locating said metal frame on one surface of a metal base in which a plurality of parallel grooves are formed in the other surface;
a step of coating said power semiconductor element and said metal frame and covering the one surface and an outer peripheral portion on the one surface side of said metal base, with a molding resin; and
a step of plastically deforming so that a caulking portion folded and formed in a substantially V shape of a sheet metal heat dissipating fin is crushed to be fixed by caulking in the groove and so that a protruded portion from the groove of the caulking portion is located at a position lower than a bottom surface of the groove.

* * * * *